(12) United States Patent
Nakamura

(10) Patent No.: US 7,282,854 B2
(45) Date of Patent: Oct. 16, 2007

(54) ORGANIC ELECTROLUMINESCENCE DEVICE HAVING A DIFFUSED LAYER

(75) Inventor: Akifumi Nakamura, Ebina (JP)

(73) Assignee: Victor Company of Japan Limited, Yokohama (JP)

( * ) Notice: Subject to any disclaimer, the term of this patent is extended or adjusted under 35 U.S.C. 154(b) by 303 days.

(21) Appl. No.: 10/827,330

(22) Filed: Apr. 20, 2004

(65) Prior Publication Data

US 2004/0212297 A1 Oct. 28, 2004

(30) Foreign Application Priority Data

Apr. 25, 2003 (JP) ............... P2003-122474
May 30, 2003 (JP) ............... P2003-155007

(51) Int. Cl.
*H01J 1/62* (2006.01)
(52) U.S. Cl. .................. 313/504; 313/506
(58) Field of Classification Search ......... 313/503–506
See application file for complete search history.

(56) References Cited

U.S. PATENT DOCUMENTS 6,013,384 A * 1/2000 Kido et al. ............... 428/690
6,023,073 A * 2/2000 Strite ........................ 257/40
6,140,763 A * 10/2000 Hung et al. ............... 313/503

FOREIGN PATENT DOCUMENTS

| JP | 2000-091078 | 3/2000 |
| JP | 2000-243567 | 9/2000 |
| JP | 2000-243569 | 9/2000 |
| JP | 2001-332390 | 11/2001 |

OTHER PUBLICATIONS

Abstract: 27a-A-6, Oyamada, T. et al., "OLED characteristics using low work function metals and the application for thick-film OLEDs", *Proceeding Paper of the 50th applied physics associated conference in Japan*, pp. 1402, (Mar. 2003).

* cited by examiner

*Primary Examiner*—Vip Patel
(74) *Attorney, Agent, or Firm*—The Nath Law Group; Jerald L. Meyer; Teresa M. Arroyo

(57) ABSTRACT

In a method for manufacturing an organic electroluminescence device of the present invention, when an anode, an organic layer including a light-emitting layer, and a cathode are sequentially formed on a substrate to manufacture an organic electroluminescence device, as the cathode, an alkali metal or a compound thereof is deposited and then a low electric resistance metal is deposited. The alkali metal and compound thereof is caused to diffuse in the low electric resistance metal and the organic layer.

3 Claims, 4 Drawing Sheets

ALKALI METAL COMPOUND
(Cs COMPOUND)

Cs (CESIUM)

Cs COMING DIRECTION

ORGANIC ELECTROLUMINESCENCE DEVICE HAVING A DIFFUSED LAYER

BACKGROUND OF THE INVENTION

The present invention relates to a method for manufacturing a productive organic electroluminescence device with high luminous efficiency and an organic electroluminescence device.

An organic electroluminescence device (hereinafter, referred to as an organic EL device), which is a self-emitting display device having features such as fast response, independence of viewing angles, and low power consumption, is receiving attention as a device for next-generation displays.

At present, an area color mode in which monochrome organic EL devices are locally combined is applied to display panels for in-car audio, and a full color mode in which red (R), green (G), and blue (B) organic EL devices are patterned by mask evaporation and the above-mentioned area color mode are applied to display panels for mobile phones.

Under such a circumstance, further research and development are being made to manufacture organic EL devices which are driven at low voltage and provide high-intensity light emission and high color reproduction.

In a typical method for manufacturing an organic EL device, for example, a light-emitting layer composed of an organic material is formed on a transparent substrate on which a film of transparent indium-tin oxide (ITO) or the like is formed as an anode (transparent electrode), and then a cathode (metal electrode) of Al, Ag, or the like is laminated thereon.

For the organic material of the light-emitting layer in this case, a wide range of materials are available including, for example, fluorescent conjugated and non-conjugated polymer materials, fluorescent small-molecular materials, fluorescent metal complexes, and further, phosphorescent heavy metal complexes and the like which emit light with very high luminous efficiency. At this time, for the method for manufacturing an organic EL device, a wet method such as application of solution or a dry method such as vacuum evaporation is selected depending on the type of an organic material to be used.

Generally, the organic EL devices are classified into a single layer type composed of a single light-emitting layer and a laminate type including a charge injection layer, a charge transport layer, a light-emitting layer, an electron injection layer, and the like which are sequentially laminated by function, using a plurality of different organic materials. In any type thereof, light emitted from the light-emitting layer can be extracted to the outside through the transparent substrate on which the transparent anode is formed or through the transparent cathode.

The Japanese Patent Publication No. 2000-91078 (page 3, FIG. 1) discloses an organic EL device including an anode, a light-emitting layer, an electron injection layer, and a cathode sequentially formed on a substrate. In this organic EL device, the electron injection layer is formed of an organic salt or an organic metal complex of an alkali metal or a Group 2 metal in order to lower turn-on voltage and increase light emission intensity.

FIG. 1 is a cross-sectional view of an organic EL device according to the above-mentioned prior art (hereinafter, referred to as prior art 1). In an organic EL device 10A shown in FIG. 1, a hole transport layer 3 and a light-emitting layer 4 are sequentially laminated on an anode (transparent electrode) 2 composed of transparent ITO or the like which has been formed on a transparent glass substrate 1. Further, as a cathode 5, a Group 2 metal 5A such as Ca or Mg and a low electric resistance metal 5B such as Al or Ag are sequentially laminated thereon. Subsequently, a desiccant 7 is attached to the inside of a top part 6a of a cap 6 which is formed into a cup shape using glass, a SUS material, or the like. This cap 6 covers the light-emitting layer 4 and the hole transport layer 3 from above the cathode 5. The bottom edge of the cap 6 is fixed onto the anode 2 and the glass substrate 1 with a UV-curing resin 8 interposed therebetween.

The Group 2 metal 5A includes a function to inject electrons into a light-emitting layer 4 side because the Group 2 metal 5A has a low work function. The low electric resistance metal 5B has a resistivity lower than other metals (for example, the resistivity of Al and Ag are $2.66 \times 10^{-6}$ $\Omega$cm and $1.59 \times 10^{-6}$ $\Omega$cm, respectively) and allows an electric current to easily flow. Accordingly, the turn-on voltage is set lower. This is because the prior art 1 uses the combination of the Group 2 metal 5A and the low electric resistance metal 5B as the cathode 5.

FIG. 2 is a cross-sectional view of an organic EL device according to another prior art (hereinafter, referred to as prior art 2). An organic EL device 10B of FIG. 2 is different from the organic EL device 10A of the prior art 1 only in the structure of the cathode 5. Specifically, the cathode 5 of the prior art 2 is formed as a mixture obtained by co-evaporating the Group 2 metal 5A such as Ca or Mg with a low work function or an alkali metal 5C such as Cs or Li with an extremely low work function, and the low electric resistance metal 5B such as Al or Ag.

SUMMARY OF THE INVENTION

However, the manufacture of the organic EL devices 10A and 10B of the aforementioned prior arts 1 and 2 revealed the following problems.

As for the organic EL device 10A of the prior art 1, it was found that the device had poor reliability because the Group 2 metal 5A was easily oxidized when the Group 2 metal 5A and the low electric resistance metal 5B were sequentially formed as the cathode 5. Furthermore, it was found that the luminous efficiency of the light-emitting layer 4 was not increased as much as expected because the function to inject electrons into the light-emitting layer 4 was inadequate although the Group 2 metal 5A had a low work function.

As for the organic EL device 10B of the prior art 2, it was found that the ratio between two kinds of metals was difficult to control to be kept constant when the Group 2 metal 5A and the low electric resistance metal 5B were co-evaporated as the cathode 5, and that the yield in manufacture of the devices was low. Moreover, it was found that, even when the alkali metal 5C and the low electric resistance metal 5B were co-evaporated as the cathode 5, the same problem as mentioned above occurred in co-evaporation although the luminous efficiency of the light-emitting layer 4 could be made larger than that in the prior art 1 because the alkali metal 5C had higher ability in electron injection than the Group 2 metal 5A.

Accordingly, there is a demand for a method for manufacturing an organic EL device which can increase the luminous efficiency of the light-emitting layer without the occurrence of oxidation of the cathode and can increase the productivity in manufacture of the devices.

Moreover, there is a demand for a method for manufacturing an organic EL device, which can prevent Cs from re-evaporizing and can accurately and easily measure the thickness of Cs deposited on the organic layer including the light-emitting layer when Cs or a compound thereof, as the alkali metal or compound thereof, is deposited on the organic layer inside a deposition apparatus after the anode, the organic layer including the light-emitting layer, and the cathode are sequentially formed on the substrate.

Furthermore, there is a demand for an organic EL device in which the turn-on voltage of the light-emitting layer can be set lower and the light-emitting layer has high luminous efficiency.

The present invention was made in the light of the above problems, and a first aspect of the present invention is a method for manufacturing an organic electroluminescence device including a first film-forming step of sequentially forming an anode layer and an organic layer including a light-emitting layer on a substrate; and a second film-forming step of depositing an alkali metal or a compound thereof and then depositing a low electric resistance metal, as the cathode layer. In the second film-forming step, the alkali metal or compound thereof is diffused in the low electric resistance metal and the organic layer.

A second aspect of the present invention is an organic electroluminescence device including an anode, an organic layer including a light-emitting layer, and a cathode which are sequentially formed on a substrate. In the cathode, an alkali metal or a compound thereof is diffused in a low electric resistance metal. Moreover, the ion radius of the alkali metal among the alkali metals and compounds thereof is larger than that of the low electric resistance metal.

DETAILED DESCRIPTION OF THE PREFERRED EMBODIMENTS

A detailed description will be given of embodiments of a method for manufacturing an organic EL device and an organic EL device according to the present invention with reference to FIGS. 3 to 8. In the following description, the same components as those of the prior arts 1 and 2 will be given the same numerals and symbols, and the description will focus on different components.

First, a description will be given of an organic EL device produced using a method for manufacturing an organic EL device according to a first embodiment of the present invention with reference to FIG. 3 and FIGS. 5 to 8.

Figure 3:
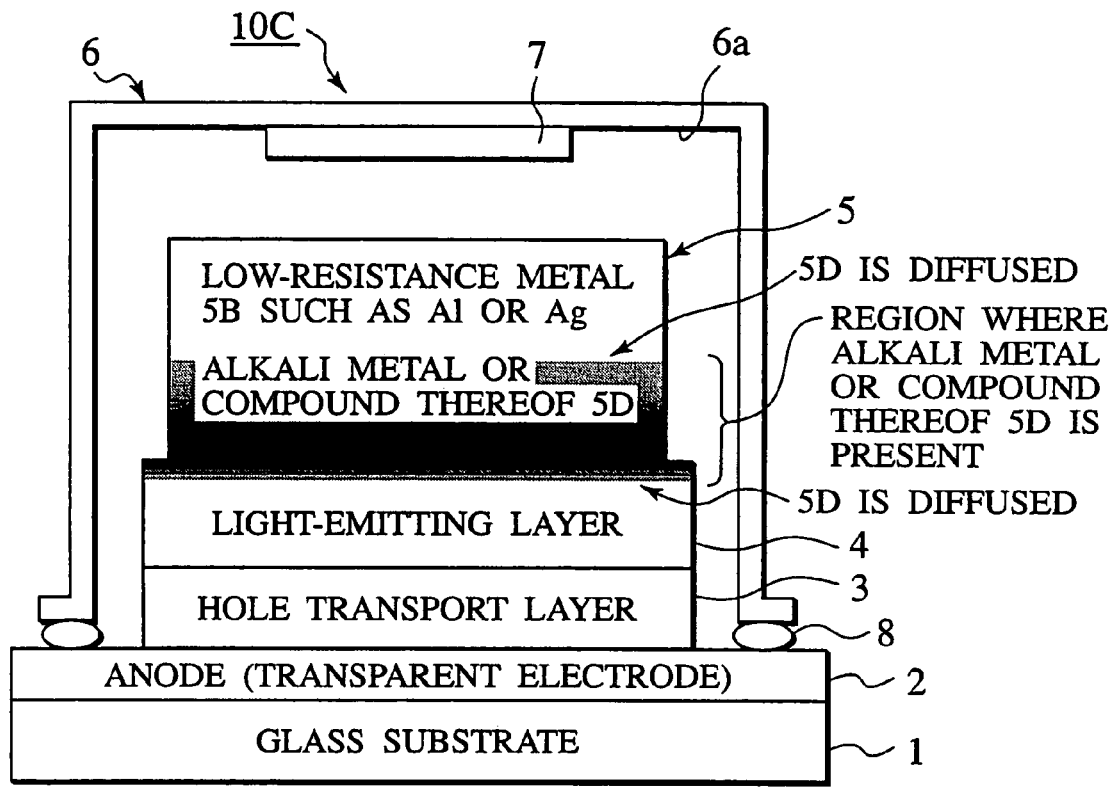
FIG. 3 is a cross-sectional view of an organic EL device produced using a method for manufacturing an organic EL device according to a first embodiment of the present invention.
Figure 5:
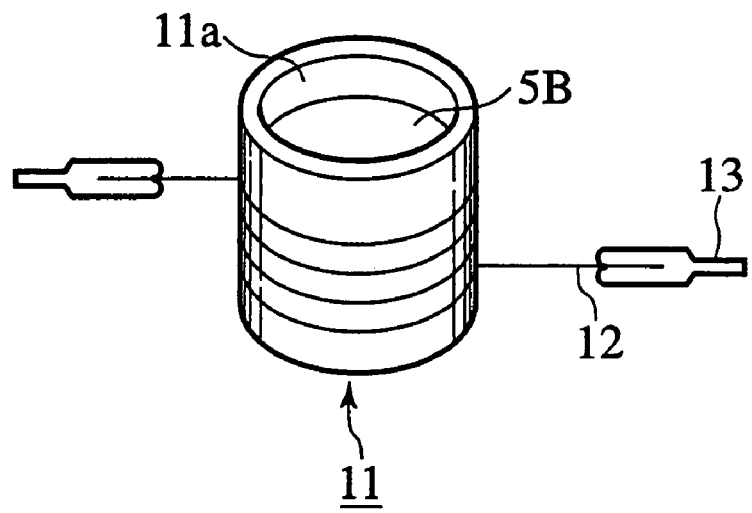
FIG. 5 is a perspective view of a crucible used in producing the organic EL devices according to the present invention.
Figure 6:
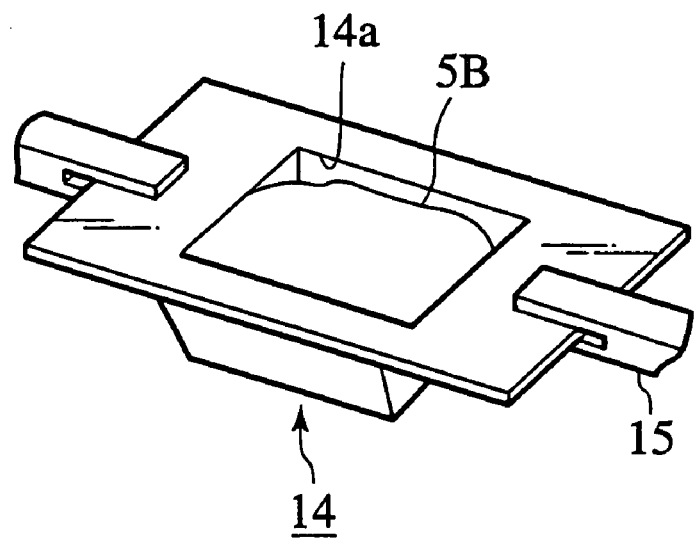
FIG. 6 is a perspective view of a boat used in producing the organic EL devices according to the present invention.
Figure 7:
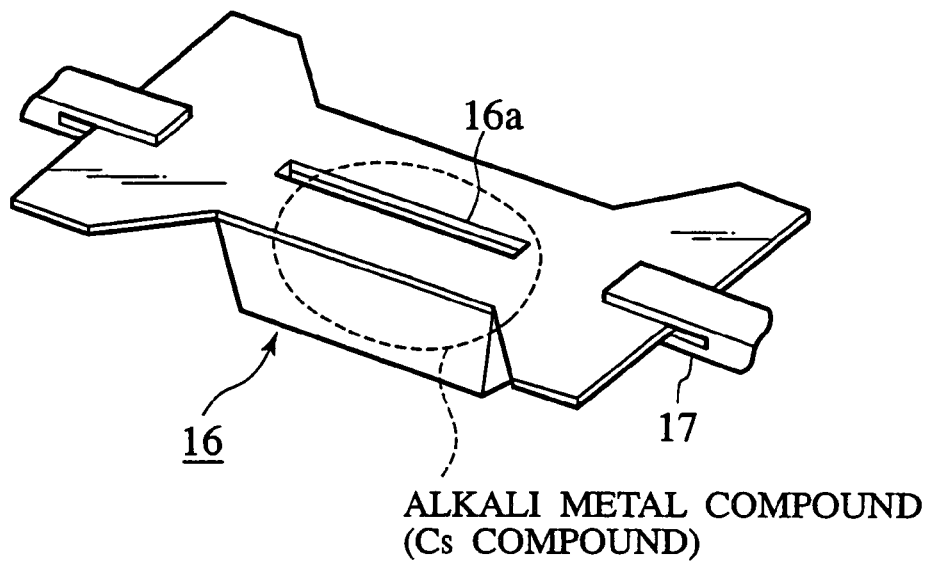
FIG. 7 is a perspective view of an alkali metal dispenser used in producing the organic EL devices according to the present invention.
Figure 8:
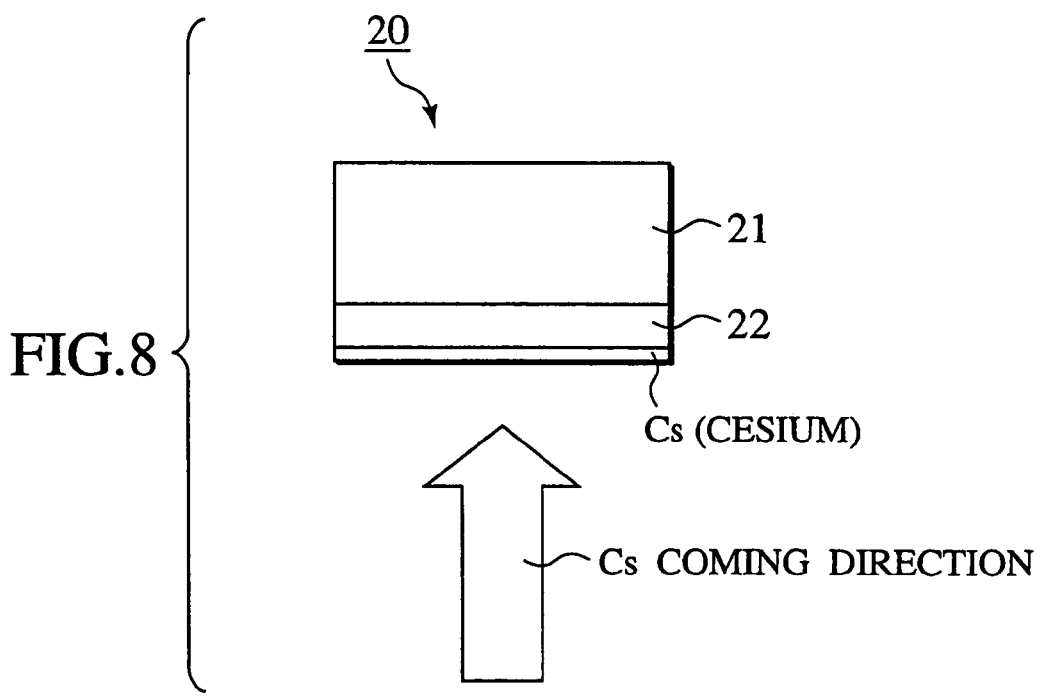
FIG. 8 is a cross-sectional view of a film thickness sensor to measure the thickness of Cs when Cs or a compound thereof is deposited on a light-emitting layer as an alkali metal or a compound thereof.

FIG. 3 is a cross-sectional view of an organic EL device produced using the method for manufacturing an organic EL device according to the first embodiment of the present invention. FIG. 5 is a perspective view of a crucible used in producing organic EL devices of the present invention. FIG. 6 is a perspective view of a boat used in producing organic EL devices of the present invention. FIG. 7 is a perspective view of an alkali metal dispenser used in producing organic EL devices of the present invention. FIG. 8 is a cross-sectional view of a film thickness sensor to measure the thickness of Cs when Cs or a compound thereof is deposited on a light-emitting layer as an alkali metal or a compound thereof.

Each apparatus shown in FIGS. 5 to 8 is also used in a later described method for manufacturing an organic EL device according to a second embodiment of the present invention.

As shown in FIG. 3, in the method for manufacturing an organic EL device 10C according to this embodiment, a film of an anode (transparent electrode) 2 made of transparent ITO or the like is formed on a transparent glass substrate 1. A hole transport layer 3 and a light-emitting layer 4 are sequentially laminated on the anode 2. Furthermore, an alkali metal or compound thereof 5D having an extremely low work function is deposited as a cathode 5, and then a low electric resistance metal 5B is deposited. This method is characterized in that, in this event, the alkali metal or compound thereof 5D is caused to diffuse into the low electric resistance metal 5B and the light-emitting layer 4.

In this case, the alkali metal may be any one of Li, Na, K, Rb, and Cs. The compound thereof 5D may be any one of oxides, nitrides, fluorides, and sulfides, and further, maybe a mixture of these. When the above compound is an oxide, it is possible to obtain an effect of improving environmental resistance. A nitride or a fluoride can have an effect that oxidation resistance is improved and characteristics remain unchanged for long time. A sulfide can have an effect of improving heat resistance. Furthermore, the mixture can combine respective features of the compounds to some extent.

Furthermore, in the case where the alkali metal or compound thereof 5D is deposited on the light-emitting layer 4, the use of an alkali metal or compound thereof 5D having an ion radius larger than that of the low electric resistance metal 5B enables the alkali metal to easily diffuse into the low electric resistance metal 5B and the light-emitting layer 4 (described later in detail). Herein, the ion radius is a radius of an ion when the ion is assumed to be a perfect sphere and is an index indicating a size of ionic crystal. Specifically, the ion radius in this embodiment means an ion radius specific to an element in the case of an alkali metal only, or a sum of the ion radius of an alkali metal and a material compounded therewith in the case of a compound of the alkali metal.

In this embodiment, Cs or a compound thereof having an extremely low work function among alkali metals (Li, Na, K, Rb, and Cs) is selected as the alkali metal or compound thereof 5D. After this Cs or compound thereof is deposited on the light-emitting layer 4, Al or Ag is deposited as the low electric resistance metal 5B having low resistivity, and the Cs or compound thereof is caused to diffuse into the Al or Ag and the light-emitting layer 4.

Note that a laminated organic layer may be formed on the anode 2. Herein, the laminated organic layer includes a charge injection layer, a charge transport layer, alight-emitting layer, an electron injection layer, and the like sequentially laminated by function, using a plurality of different organic materials. In this case, the alkali metal or compound thereof 5D may be diffused into the low electric resistance metal 5B and the organic layer including the light-emitting layer 4.

After each layer is formed on the glass substrate 1, a moisture absorbent 7 is attached to the inside of a top part 6a of a cap 6, which is formed into a cup shape using glass, a SUS material, or the like. This cap 6 covers the light-emitting layer 4 and the hole transport layer 3 from above the cathode 5, and the bottom edge of the cap 6 is fixed onto the anode 2 or the glass substrate 1 with UV-curing resin 8 interposed therebetween.

Next, the method for manufacturing an organic EL device of this embodiment will be described more concretely.

Various materials such as glass and plastics are available for the substrate, and this embodiment uses an ITO substrate in which a transparent ITO film to be used as the anode 2 is formed to a thickness of about 50 to 300 nm on the transparent glass substrate 1 in advance. Hereinafter, the glass substrate 1 and the anode 2 which is the ITO film formed in advance are collectively referred to as an ITO substrate 1, 2. In this ITO substrate 1, 2, the anode 2 is patterned into a predetermined shape according to various applications such as illumination, high resolution displays, televisions, and mobile phones, by using photolithography, wet etching, or the like.

Subsequently, PEDOT/PSS, which is a hole-transporting conductive polymer material (i.e. material with a conductive polymer structure) and optimum for the hole transport layer 3, is dropped on the ITO substrate 1, 2, and the ITO substrate 1, 2 is rotated at 2000 rpm for 60 seconds by spin coating to form the hole transport layer 3 with a thickness of about 60 nm. Herein, the PEDOT is poly(3,4-ethylenedioxythiophene), and the PSS is polystyrene sulfonate.

After the hole transport layer 3 is formed on the ITO substrate 1, 2, the ITO substrate 1, 2 with the hole transport layer 3 formed thereon is placed in an oven or on a hot plate in an inert gas atmosphere such as nitrogen controlled to have a low humidity with a dew point of not more than −60° C., and dried at about 200° C. for 10 minutes or more. The ITO substrate 1, 2 with the hole transport layer 3 dried thereon is then taken from the oven or the hot plate and cooled to room temperature, for example, by being placed on a cooling plate (not shown) at room temperature.

Subsequently, a liquid for the light-emitting layer is dropped on the ITO substrate 1, 2 which includes the PEDOT/PSS deposited thereon as the hole transport layer 3. Herein, the liquid is obtained by dissolving, in chloroform, 0.5 wt % of PVK (polyvinylcarbazole) which is a hole transporting conductive polymer material, OXD-7: (1,3-bis (4-tert-butylphenyl-1,3,4-oxadiazol)-2-yl)benzene which is an electron transporting material, and green phosphorescent dye Ir(ppy)3 which is a tris(2-phenylpyridine)iridium complex. The ITO substrate 1, 2 is then rotated at 1600 rpm for 60 seconds by spin coating to form the light-emitting layer 4 with a thickness of about 70 nm. At this time, the electron transporting material OXD-7 and the green phosphorescent dye Ir(ppy)3 are set to approximately 30 wt % and 2.5 wt % of PVK, respectively.

After the light-emitting layer 4 is formed on the hole transport layer 3, the ITO substrate 1, 2 with the light-emitting layer 4 formed thereon is placed in an oven or on a hot plate in an inert gas atmosphere such as nitrogen controlled to have low humidity with a dew point of not more than −60° C., and dried at a temperature of about 90° C. for one hour or more. Subsequently, the ITO substrate 1, 2 with the light-emitting layer 4 dried thereon is taken from the oven or the hot plate and cooled to room temperature, for example, byn being placed on a cooling plate (not shown) at room temperature.

Subsequently, in order to form a film of the cathode 5, which is substantial part of the present invention, on the light-emitting layer 4 by resistance heated vacuum evaporation, the ITO substrate 1, 2 with the light-emitting layer 4 formed thereon is placed at a predetermined position inside a vacuum evaporator (not shown) as a deposition apparatus. Furthermore, a low electric resistance metal evaporation source and an alkali metal evaporation source (Cs evaporation source) are attached inside the vacuum evaporator. The low electric resistance metal evaporation source contains the low electric resistance metal 5B such as Al or Ag as a metal with high stability and low resistivity. The alkali metal evaporation source contains, for example, Cs or a compound thereof as the alkali metal or compound thereof 5D with an extremely low work function. The vacuum evaporator is evacuated to a degree of vacuum of not more than 10-4 Pa.

Herein, in the case of using a crucible 11 as shown in FIG. 5 as the low electric resistance metal evaporation source, the low electric resistance metal 5B such as Al or Ag is melted in the crucible 11. At this time, a wire 12 of W, Mo, or the like is wound around the circumference of the crucible 11, and an electric current is applied to this wire 12 at both ends thereof via conductive dampers 13 to heat the crucible 11. The low electric resistance metal 5B such as Al or Ag is melted within a circular recess portion 11a of the crucible 11.

In the case of using a boat 14 as shown in FIG. 6 as the low electric resistance metal evaporation source instead of the crucible 11, the low electric resistance metal 5B such as Al or Ag is melted in the boat 14. At this time, the low electric resistance metal 5B such as Al or Ag is melted within a rectangular recess portion 14a of the boat 14 by applying an electric current to the boat 14 at both ends thereof via conductive dampers 15 to heat the boat 14.

These are similarly carried out in the case of the alkali metal compound.

Preferably, an alkali metal dispenser 16 shown in FIG. 7 is used as the alkali metal evaporation source because the alkali metal is very highly reactive and is immediately oxidized on coming into contact with air. In the case of evaporating Cs or a compound thereof as the alkali metal or compound thereof 5D, it is preferable to apply the alkali metal dispenser 16 containing therein a Cs compound as the alkali metal compound (Cs evaporation source commercially available from SAES Getters, S.p.A: 5G0040 or the like). An electric current is applied to the alkali metal dispenser 16 at both ends thereof via conductive dampers 17 to heat the alkali metal dispenser 16, and the Cs compound contained in the alkali metal dispenser 16 in a form stabilized as a Cs Chromate is melted. Materials other than the Cs compound are reduced by a getter material (not shown), and only Cs is evaporated from a slit 16a formed in an elongated shape in the upper portion of the alkali metal dispenser 16.

Next, a detailed description will be given of the method for forming the cathode 5, as the substantial part of the present invention, on the light-emitting layer 4 by the resistance heated vacuum evaporation with reference to FIG. 3.

When the cathode 5 as substantial part of the present invention is formed on the light-emitting layer 4 by the resistance heated vacuum evaporation, first, Cs (or compound thereof), which has an extremely low work function among alkali metals (Li, Na, K, Rb, and Cs), is deposited on the light-emitting layer 4 using the alkali metal dispenser 16 shown in FIG. 7.

At this time, the thickness of Cs deposited on the light-emitting layer 4 is measured in real-time by using a film thickness sensor 5 shown in FIG. 8. The Cs is deposited to a thickness of about 10 to 20 nm at a deposition rate ranging from 0.05 to 0.1 nm/sec, which is being monitored by the film thickness sensor 20.

At this time, in this embodiment, the film thickness sensor 20 shown in FIG. 8 is set in advance at a position different from the position of the glass substrate 1 inside the vacuum evaporator (not shown), which is a deposition apparatus (not shown) for depositing Cs, and the thickness of Cs deposited on the light-emitting layer 4 is measured with this film thickness sensor 20.

In the film thickness sensor 20, as shown in FIG. 8, an organic film 22 is formed in advance to substantially the same thickness (about 10 to 20 nm) as that of Cs on a known quartz crystal 21 by vacuum evaporation or the like. Preferably, the material of this organic film 22 is an organic material which can be evaporated and form an amorphous film, for example, such as bathocuproine, bathophenanthroline, Alq3, or the like, which is often used in manufacture of organic EL devices. When coming Cs hits the organic film 22, the Cs is diffused into the organic film 22. Therefore, the organic film 22 prevents Cs from re-evaporizing and allows the thickness of Cs to be accurately measured. Accordingly, the thickness of Cs deposited on the light-emitting layer 4 can be indirectly measured through the film thickness sensor 20 as follows. Inside the vacuum evaporator (not shown), Cs is simultaneously deposited on the light-emtting layer 4 of the organic EL device 10C and on the organic film 22 of the film thickness sensor 20, and a film thickness value of the Cs deposited on the organic film 22, which can be obtained correspondingly to oscillation frequency of the quartz crystal 21, is measured with the film thickness sensor 20.

In the case where both the glass substrate 1 and the film thickness sensor 20 are placed side by side when the glass substrate 1 and the film thickness sensor 20 are set at different positions inside the vacuum evaporator, the condition for depositing Cs on the light-emitting layer 4 is the same as the condition for depositing Cs on the organic film 22. Accordingly, the thickness of Cs deposited on the light-emitting layer 4 of the organic EL device 10C can be obtained at substantially the same value as the thickness of Cs deposited on the organic film 22 of the film thickness sensor 20. On the other hand, in the case where the glass substrate 1 and the film thickness sensor 22 cannot be placed side by side, the condition for depositing Cs on the light-emitting layer 4 is different from the condition for depositing Cs on the organic film 22. In this case, however, it is merely necessary to previously know the correspondence relationship between the thickness of Cs deposited on the light-emitting layer 4 of the organic EL device 10C and the thickness of Cs deposited on the organic film 22 of the film thickness sensor 20.

Thus, it is possible to prevent Cs from re-evaporizing and to accurately and easily measure the thickness of Cs deposited on the light-emitting layer 4 through the film thickness sensor 20. Therefore, it is not necessary to use an expensive atomic absorption spectrometry, thus reducing costs.

After Cs with an extremely low work function is deposited on the light-emitting layer 4 in the above-described manner, the low electric resistance metal 5B is deposited in such a manner that the crucible 11 (FIG. 5) or boat 14 (FIG. 6) containing the low electric resistance metal 5B such as Al or Ag is energized while the inside of the vacuum evaporator is maintained at a degree of vacuum of 10-4 Pa or below. At this time, the thickness of the low electric resistance metal 5B such as Al or Ag is measured using the film thickness sensor 20 (not shown). It is preferable if the low electric resistance metal 5B is deposited to a thickness of about 200 nm at a deposition rate ranging from 1 to 10 nm/sec, which is being monitored with the film thickness sensor 20, so that Cs can be easily diffused into the low electric resistance metal 5B and the light-emitting layer 4.

In deposition of the low electric resistance metal 5B such as Al or Ag, the flow rate of oxygen is controlled by introducing oxygen with a mass flow controller (not shown) such that the degree of vacuum inside the vacuum evaporator becomes about 10-3 Pa when the deposition rate reaches a predetermined deposition rate in a range of 1 to 2 nm/sec, thus enabling control of the luminous efficiency and the lifetime. The introduction of oxygen and the deposition are stopped at the time when the thickness of the low electric resistance metal 5B reaches about 100 nm, and after the degree of vacuum inside the vacuum evaporator becomes 10-4 Pa or below, the low electric resistance metal 5B is further deposited to another thickness of about 100 nm. Accordingly, the total thickness of the low electric resistance metal 5B becomes about 200 nm, and the average amount of oxygen in the region where the alkali metal or compound thereof 5D is present becomes about 15 atom %.

As described above, the amount of oxygen can be controlled by the flow rate of oxygen during evaporation. As the number of oxygen atoms increases, the luminescence lifetime increases but the luminous efficiency is lowered. Accordingly, the electric resistance is increased, which causes a problem that the turn-on voltage is increased. It was found that the amount of oxygen is therefore preferably controlled within a range of 0% to less than 50% in the region where the alkali metal or compound thereof 5D is present.

Furthermore, in the case where Cs (ion radius is 1.69 Å) is deposited on the light-emitting layer 4 as the alkali metal, Cs is diffused to a depth of about 50 nm in, for example, Al (ion radius is 0.50 Å) as the low electric resistance metal 5B and diffused to a depth of about 20 nm in the light-emitting layer 4.

On the other hand, in the case where Ca (ion radius is 0.99 Å), which is an Group 2 metal 5A used in the prior art 1, is diffused into, for example, Ag (ion radius is 1.26 Å) as the low electric resistance metal 5B, the diffusion is suppressed compared to the case of diffusion in Al. Therefore, this case is not preferable in terms of the stability of the organic EL device and the luminous efficiency. Moreover, also in the case of using Al having an ion radius smaller than that of Ca, Ca is difficult to diffuse because the radius ratio of Al to Ca is not large. In this case, it is preferable if the glass substrate 1 is heated and controlled within a range of about 30° C. to 50° C. during the deposition of Al, so that Ca is easily diffused. As described above, it is required to control diffusion by the temperature of the glass substrate 1 depending on the material. Thereafter, dry nitrogen is flown in the vacuum evaporator until the pressure inside becomes one atm.

As described above, the use of an alkali metal having an ion radius larger than that of the low electric resistance metal 5B is preferred because the distances over which the alkali metal diffuses into the low electric resistance metal 5B and the light-emitting layer 4 are increased.

Subsequently, the ITO substrate 1, 2 on which the cathode 5 is formed while the dry atmosphere with a dew point of not more than −60° C. is maintained, is taken out and moved to a glove box (not shown) in which dry atmosphere with a dew point of not more than −60° C. is maintained. Meanwhile, the UV-curing resin 8 is applied to the bottom edge of the cap 6, which is formed into a cup shape using glass, a SUS material, or the like, and the cap 6 is placed in the glove box.

The cap 6 is installed so as to cover the light-emitting layer 4 and the hole transport layer 3 in the glove box, and while the atmosphere is maintained, the UV-curing resin 8 is irradiated with UV light for a predetermined period of time to be cured for sealing. If a barium oxide or a calcium oxide is encapsulated as the moisture absorbent 7 at the top part 6a of the cap 6, it is possible to absorb moisture inside the cap 6.

As described above, the organic EL device 10C produced using the method for manufacturing an organic EL device according to this embodiment is the most preferable when Cs or a compound thereof is used as the alkali metal or compound thereof 5D. This organic EL device 10C started to emit light at a voltage of around 3 V and exhibited a maximum brightness of about 50000 cd/m$^2$ and a luminous efficiency of 31 cd/A. The period (half brightness life) since the organic EL device 10C started to emit light at 100 cd/m$^2$ until its brightness was reduced by half, was about 10000 hours. Consequently, in this embodiment, even if the alkali metal or compound thereof 5D having an extremely low work function is used as the cathode 5, it is possible to ensure the reliability of the device without the occurrence of oxidation of the alkali metal or compound thereof 5D, and to set the turn-on voltage for the light-emitting layer 4 to be lower. Furthermore, it is possible to realize high luminous efficiency of the light-emitting layer 4, and to increase the productivity in manufacture of the device.

The organic EL device 10C produced using the method for manufacturing an organic EL device according to this embodiment in the case where the amount of oxygen is 20 atom %, started to emit light at a voltage of around 4V and exhibited a maximum brightness of about 40000 cd/m$^2$ and a luminous efficiency of 28 cd/A. These values are lower than the aforementioned values, respectively, but the period (half brightness life) since this organic EL device 10C started to emit light at 100 cd/m$^2$ until its brightness was reduced by half was about 12000 hours, which is longer than the aforementioned value.

Next, a brief description will be given of an organic EL device of a modified example produced using a method for manufacturing an organic EL device according to a second embodiment of the present invention with reference to FIG. 4.

Figure 4:
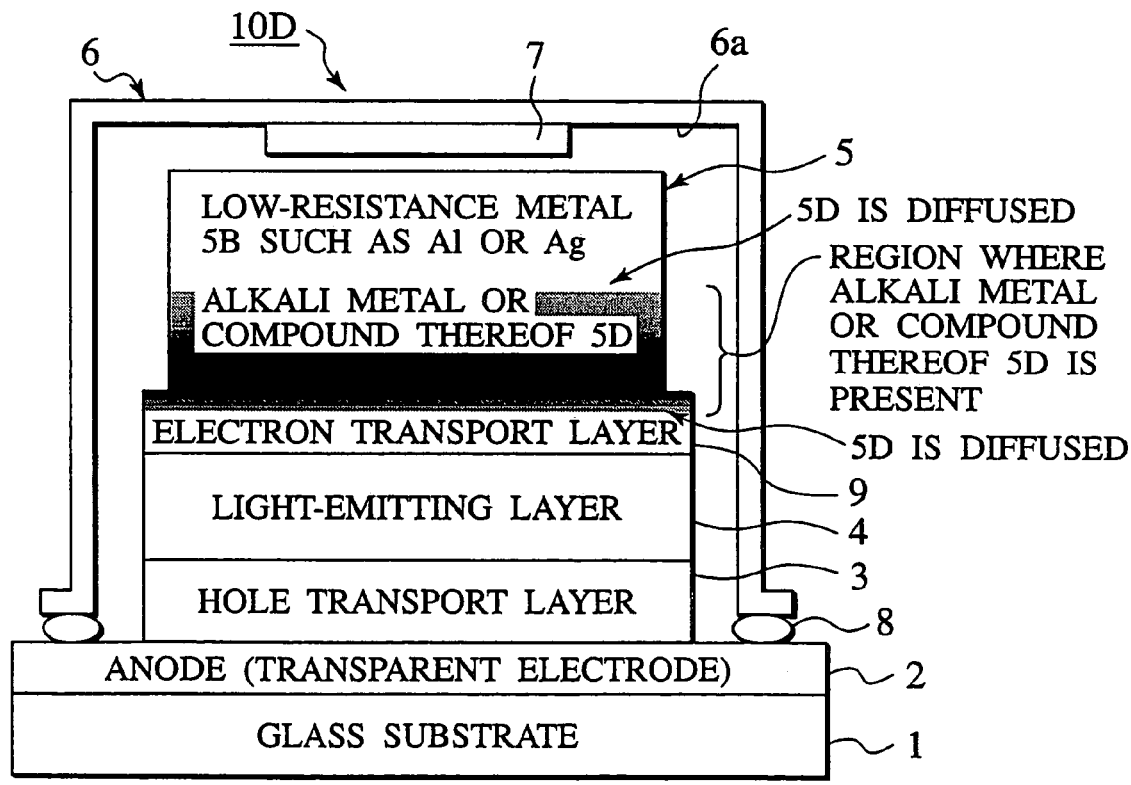
FIG. 4 is a cross-sectional view of an organic EL device produced using a method for manufacturing an organic EL device according to a second embodiment of the present invention.

FIG. 4 is a cross-sectional view of an organic EL device produced by the method for manufacturing an organic EL device according to the second embodiment of the present invention.

As shown in FIG. 4, in the case of manufacturing an organic EL device 10D according to this embodiment, first, an electron transport layer 9 of bathocuproine, bathophenanthroline, or the like is formed as the organic layer to a thickness of about 20 nm on the light-emitting layer 4. After the alkali metal or compound thereof 5D is deposited as the cathode 5 on this electron transport layer 9, the alkali metal or compound thereof 5D is caused to diffuse in the low electric resistance metal 5B and the electron transport layer 9 while the low electric resistance metal 5B is deposited.

At this time, the alkali metal or compound thereof 5D may be diffused into the light-emitting layer 4 through the electron transport layer 9.

Next, results will be shown of producing the organic EL devices 10A and 10B of the prior arts 1 and 2, respectively, as comparative examples to the organic EL device 10C produced by the method for manufacturing an organic EL device according to the first embodiment of the present invention.

In each of the organic EL devices 10A and 10B of the prior arts 1 and 2, the steps of sequentially forming the hole transport layer 3 and the light-emitting layer 4 on the ITO substrate 1, 2 and the step of sealing with the cap 6 after forming the cathode 5 are the same as those in the method for manufacturing an organic EL device according to the first embodiment of the present invention. A description will therefore be given of only film-forming of the cathode 5 in the organic EL devices 10A and 10B with reference to FIGS. 1 and 2.

Figure 1:
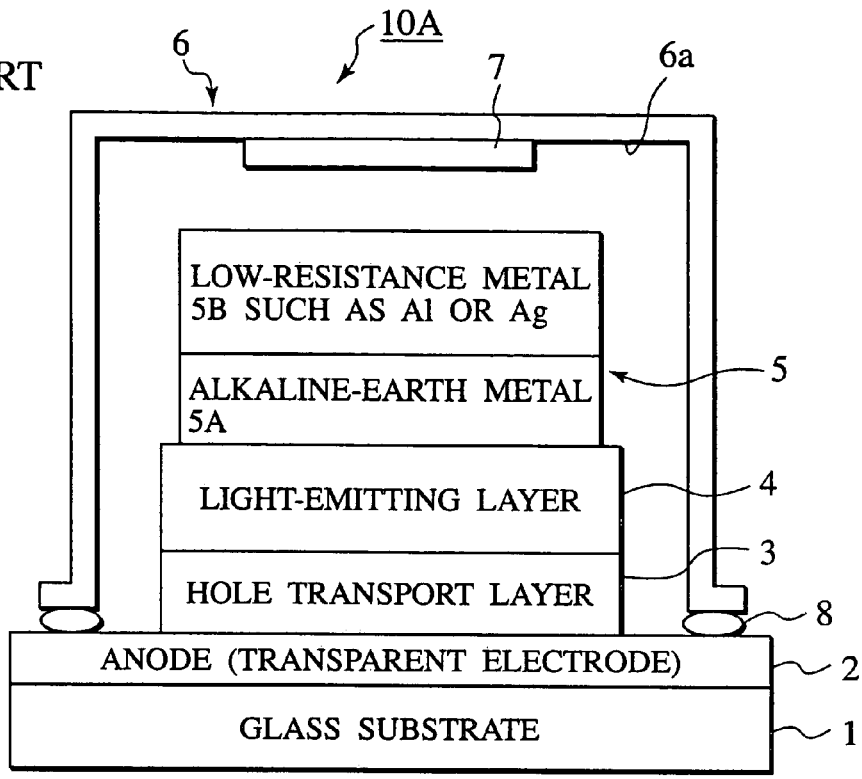
FIG. 1 is a cross-sectional view of an organic EL device of a prior art.

First, in the case of the organic EL device 10A of the prior art 1 shown in FIG. 1, in order to form a film of the cathode by resistance heated vacuum evaporation, the ITO substrate 1, 2 with the hole transport layer 3 and the light-emitting layer 4 formed thereon is placed at a predetermined position inside a vacuum evaporator (not shown), and a Group 2 metal evaporation source and a low electric resistance metal evaporation source are attached. The Group 2 metal evaporation source contains the Group 2 metal 5A such as Ca or Mg. The low electric resistance metal evaporation source contains the low electric resistance metal 5B such as Al or Ag. The vacuum evaporator is then evacuated to a degree of vacuum of not more than 10-4 Pa. For these Group 2 metal and low electric resistance metal evaporation sources, the Group 2 metal 5A and the low electric resistance metal 5B, respectively, simply need to be melted in advance in the crucibles 11 shown in FIG. 5 or the boats 14 shown in FIG. 6.

Herein, after energizing the Group 2 metal evaporation source, the Group 2 metal 5A is deposited on the light-emitting layer 4 to a thickness of about 10 to 50 nm at a deposition rate ranging from 1.0 to 2.0 nm/sec, which is being monitored by a film thickness sensor (not shown). Subsequently, while the degree of vacuum in the vacuum evaporator is maintained at more than 10-4 Pa, the crucible 11 (FIG. 5) or the boat 14 (FIG. 6) containing the low electric resistance metal 5B such as Al or Ag is energized, and the low electric resistance metal 5B is deposited on the Group 2 metal 5A to a thickness of about 200 to 300 nm at a deposition rate ranging from 0.1 to 1 nm/sec, which is being monitored by the film thickness sensor (not shown). There was no noticeable change in characteristics of the device in this range. However, when the film thickness of the low electric resistance metal 5B was not more than 200 nm, the half brightness life was shortened. The film of the low electric resistance metal 5B includes functions to prevent the previously deposited Group 2 metal 5A from being oxidized and to reduce the electric resistance.

According to the method for prior art 1, since the deposition rate of the low electric resistance metal 5B is small and the glass substrate 1 is not heated, the Group 2 metal 5A does not diffuse very much, thus having an influence of the deterioration due to oxidation of Ca, Mg, or the like. In the case of using, for example, Ca as the Group 2 metal 5A and using, for example, Al as the low electric resistance metal 5B, the organic EL device 10A of the prior art 1 obtained after final sealing started to emit light at a voltage of around 5 V and exhibited a maximum brightness of about 20000 cd/m², a luminous efficiency of about 20 cd/A, and a half brightness life of about 1000 hours. Accordingly, comparing the organic EL device 10A of the prior art 1 with the organic EL device 10C produced by the present invention, in which Cs is diffused into the low electric resistance metal 5B and the organic layer 4, the turn-on voltage of the prior art 1 was higher than that in the case of present invention by about 1 to 2 V, and the maximum brightness thereof is lower than that in the case of present invention by about 20000 to 30000 cd/M². Moreover, the luminous efficiency of the prior art 1 was lower than that in the case of the present invention by about 8 to 11 cd/A, and the half brightness life thereof dramatically dropped to about 1/12 to 1/10.

Figure 2:
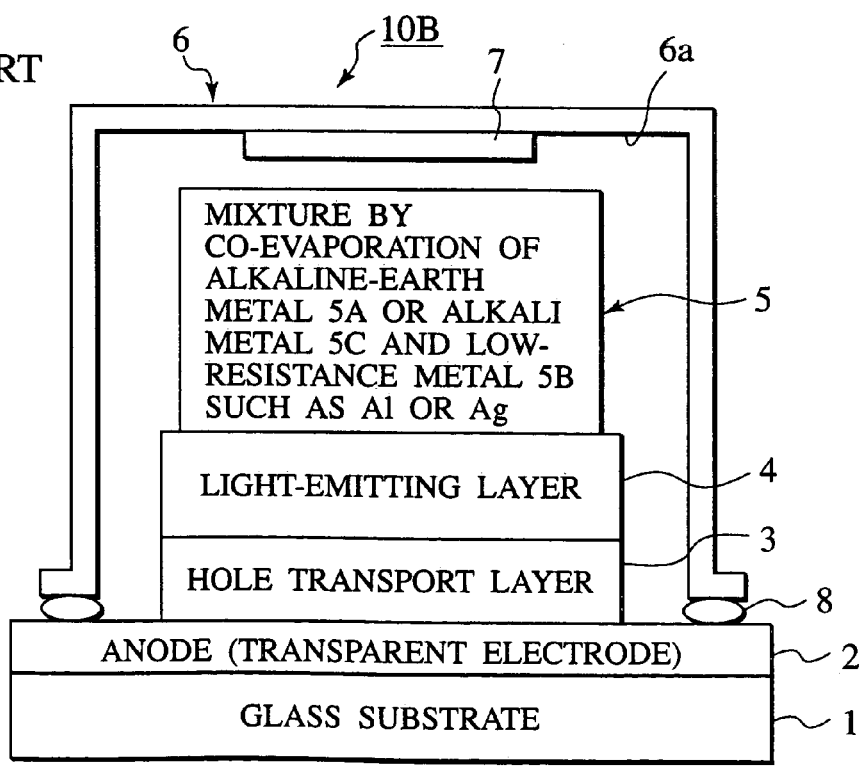
FIG. 2 is a cross-sectional view of an organic EL device of another prior art.

Next, also in the case of the organic EL device 10B of the prior art 2 shown in FIG. 2, in order to form a film of the cathode 5 by resistance heated vacuum evaporation, the ITO substrate 1, 2 with the hole transport layer 3 and the light-emitting layer 4 formed thereon is placed at a predetermined position inside a vacuum evaporator (not shown), and a Group 2 metal evaporation source or an alkali metal evaporation source, and a low electric resistance metal evaporation source are attached. The Group 2 metal evaporation source contains the Group 2 metal 5A such as Ca or Mg. The alkali metal evaporation source contains an alkali metal 5C such as Li or Cs. The low electric resistance metal evaporation source contains the low electric resistance metal 5B such as Al or Ag. The vacuum evaporator is evacuated at a degree of vacuum of not more than 10-4 Pa. For these Group 2 metal and low electric resistance metal evaporation sources, the Group 2 metal 5A and the low electric resistance metal 5B, respectively, simply need to be melted in advance in the crucibles 11 shown in FIG. 5 or the boats 14 shown in FIG. 6. For the alkali metal evaporation source for Cs or the like, the alkali metal dispenser 16 shown in FIG. 7 is simply used.

Herein, after simultaneously energizing the Group 2 metal or alkali metal evaporation source and the low electric resistance metal evaporation source, the Group 2 metal 5A or alkali metal 5C and the low electric resistance metal 5B were deposited at a deposition rate ranging from 0.5 to 2.0 nm/sec, which is being monitored by a film thickness sensor (not shown), while a predetermined ratio of 1/9 to 9/1 is maintained. During the evaporation, the amounts of the remaining evaporation materials and the ratio thereof were always changing. Accordingly, the amounts of current to be applied to the respective evaporation sources had to be changed according to the remaining amounts and the ratio thereof to control the deposition rate at constant, and therefore the operation thereof was difficult.

The ratio of materials differs depending on the materials, and for example, the ratio of Cs to Ag was preferably 1/1. Last of all, sealing was performed.

The organic EL device 10B of the prior art 2 which used, for example, Cs and Ag started to emit light at a voltage of around 3V and exhibited a maximum brightness of about 50000 cd/m² and a luminous efficiency of 31 cd/A. The half brightness life thereof was about 10000 hours.

Since Cs and Ag, for example, are co-evaporated, the organic EL device 10B of the prior art 2 can provide the capability substantially equivalent to that of the organic device 10C produced by the first embodiment. However, it was found that the co-evaporation of two kinds of metals, e.g. Cs and Ag, was very difficult while the metals were controlled to keep the constant ratio therebetween, this had an adverse effect on yield, and the productivity of the device could not be increased.

As apparent from the above description, according to the method for manufacturing an organic EL device of the present invention, when an anode, an organic layer including a light-emitting layer, and a cathode are sequentially formed on a substrate to manufacture a device, as the cathode, a low electric resistance metal is deposited after an alkali metal or a compound thereof is deposited, and the alkali metal or compound thereof is caused to diffuse in the low electric resistance metal and the organic layer. Accordingly, even in the case of using an alkali metal or a compound thereof having an extremely low work function, the reliability of the device can be ensured without the occurrence of oxidation of the alkali metal or compound thereof, and the turn-on voltage for the light-emitting layer can be set lower. Moreover, it is possible to obtain an organic EL device including the light-emitting layer with high luminous efficiency and having high productivity in manufacture. At this time, for example, in the case of using an oxide of an alkali metal, as an alkali metal compound among alkali metals and compounds thereof, it is possible to obtain an effect of improving environmental resistance. A nitride or a fluoride thereof can have an effect that oxidation resistance is improved and characteristics remain unchanged for long time. A sulfide thereof can have an effect of improving heat resistance. Furthermore, a mixture thereof can combine respective features of the compounds to some extent.

Moreover, according to the method for manufacturing an organic EL device of the present invention, when the anode, the organic layer including the light-emitting layer, and the cathode are sequentially formed on the substrate to manufacture the device, in the case where an alkali metal and a low electric resistance metal are sequentially deposited as the cathode, Cs selected among alkali metals is deposited on the organic layer. Moreover, when the film thickness of Cs is measured in real-time, a film thickness sensor in which an organic film is previously deposited on a quartz crystal is set at a position different from the position of the substrate inside a deposition apparatus and then Cs is deposited simultaneously on the organic layer and on the organic film, whereby the thickness of Cs deposited on the organic layer is measured through the film thickness sensor. Accordingly, it is possible to prevent Cs from re-evaporizing and to accurately and easily measure, through the film thickness sensor, the thickness of Cs deposited on the organic layer including the light-emitting layer. It is therefore not necessary to use expensive atomic absorption spectrometry, thus reducing costs.

Furthermore, according to the organic EL device of the present invention, in an organic EL device including an anode, an organic layer including a light-emitting layer, and a cathode sequentially formed on a substrate, the cathode includes an alkali metal or a compound thereof diffused in a low electric resistance metal. Moreover, the ion radius of an alkali metal among alkali metals and compounds thereof is larger than that of the low electric resistance metal. Accordingly, the alkali metal or compound thereof can be well diffused in the low electric resistance metal and the organic layer. Therefore, it is possible to set the turn-on voltage for the light-emitting layer lower and to obtain an organic EL device including the light-emitting layer with high luminous efficiency.

What is claimed is:
1. An organic electroluminescence device comprising:
   an anode layer formed on a substrate;
   an organic layer which is formed on the anode layer and includes a light-emitting layer; and
   a cathode layer having:

an alkali metal compound layer which is made of an alkali metal compound including Cs and oxygen and is formed directly on the light-emitting layer; and a low electric resistance metal layer which is made of a low electric resistance metal and is formed directly on the alkali metal compound layer, wherein both of the light-emitting layer and the low electric resistance metal layer are made of an alkali metal compound including Cs and oxygen.

2. The organic electroluminescence device according to claim 1, wherein the alkali metal compound layer having a thickness in a range from 10 to 20 nm in the cathode layer.

3. The organic electroluminescence device according to claim 1, wherein the low electric resistance metal forms a layer having a thickness of substantially 200 nm in the cathode layer.

* * * * *